(12) United States Patent
Uchiyama et al.

(10) Patent No.: US 8,314,347 B2
(45) Date of Patent: Nov. 20, 2012

(54) WIRING BOARD WITH LEAD PINS AND METHOD OF PRODUCING THE SAME

(75) Inventors: Kenta Uchiyama, Nagano (JP); Akihiko Tateiwa, Nagano (JP); Yuji Kunimoto, Nagano (JP)

(73) Assignee: Shinko Electric Industries Co., Ltd., Nagano-shi (JP)

( * ) Notice: Subject to any disclaimer, the term of this patent is extended or adjusted under 35 U.S.C. 154(b) by 286 days.

(21) Appl. No.: 12/637,244

(22) Filed: Dec. 14, 2009

(65) Prior Publication Data

US 2010/0147561 A1    Jun. 17, 2010

(30) Foreign Application Priority Data

Dec. 15, 2008  (JP) ................................. 2008-317912

(51) Int. Cl.
*H05K 1/11* (2006.01)
*H05K 1/09* (2006.01)
*H01B 5/00* (2006.01)
*H01L 23/48* (2006.01)

(52) U.S. Cl. ...................... 174/261; 174/126.1; 174/251; 174/263; 174/267; 257/697; 257/779; 257/780; 257/781

(58) Field of Classification Search .................. 174/267, 174/126.1, 251, 261, 263; 257/697, 779–781
See application file for complete search history.

(56) References Cited

U.S. PATENT DOCUMENTS

| | | | | |
|---|---|---|---|---|
| 5,288,944 A | * | 2/1994 | Bronson et al. | 174/539 |
| 5,373,110 A | * | 12/1994 | Inasaka | 174/267 |
| 6,270,362 B1 | * | 8/2001 | Guran et al. | 439/83 |
| 6,583,366 B2 | * | 6/2003 | Saiki | 174/267 |
| 7,102,230 B2 | * | 9/2006 | Yang | 257/738 |
| 2007/0145561 A1 | * | 6/2007 | Tsai et al. | 257/685 |
| 2008/0009155 A1 | * | 1/2008 | Ide et al. | 439/83 |
| 2008/0265398 A1 | * | 10/2008 | Matsumoto et al. | 257/697 |
| 2008/0296752 A1 | * | 12/2008 | Nakajima | 257/697 |
| 2009/0056992 A1 | * | 3/2009 | Takeuchi et al. | 174/257 |

FOREIGN PATENT DOCUMENTS

| | | | |
|---|---|---|---|
| JP | 2000-058736 | | 2/2000 |
| JP | 2000058736 A | * | 2/2000 |
| JP | 2001-148441 | | 5/2001 |
| JP | 2001-177010 | | 6/2001 |

OTHER PUBLICATIONS

Machine Translation of JP 2000-058736 A: Hamano et al.; Pin Connection Method to Resin Substrate; Feb. 2000.*

* cited by examiner

*Primary Examiner* — Timothy Thompson
*Assistant Examiner* — Sherman Ng
(74) *Attorney, Agent, or Firm* — Rankin, Hill & Clark LLP

(57) ABSTRACT

A wiring board with lead pins includes: connection pads formed on a wiring board, and lead pins bonded through a conductive material to the connection pads, wherein each of the lead pins has a head portion that is formed in one end of a shaft portion to be larger in diameter than the shaft portion, the head portions are bonded to the connection pads by the conductive material, a face of the wiring board on which the connection pads are formed is resin-sealed by a first resin to be thicker than the head portions, except portions to which the head portions are bonded, and sides of faces of the head portions to which the shaft portions are connected are sealed to be in close contact with the first resin by a second resin.

13 Claims, 7 Drawing Sheets

US 8,314,347 B2

WIRING BOARD WITH LEAD PINS AND METHOD OF PRODUCING THE SAME

CROSS-REFERENCE TO RELATED APPLICATION

This application is based on and claims priority under 35 U.S.C. §119 from Japanese Patent Application No. 2008-317912 filed on Dec. 15, 2008.

BACKGROUND OF THE INVENTION

1. Technical Field

The present invention relates to a wiring board with lead pins and a method of producing it, and more particularly to a wiring board with lead pins in which the bonding strength of the lead pins with respect to a wiring board is improved, and a method of producing the wiring board.

2. Related Art

A wiring board with lead pins is formed by bonding the lead pins to connection pads formed on a wiring board by using a bonding conductive material such as a solder. In a wiring board with lead pins which is formed by bonding lead pins to connection pads by using a solder or the like, usually, lead pins in each of which a flat disk-like head portion is formed integrally with one end of a shaft portion into a nail-like shape are used.

FIGS. 7A and 7B show a conventional method of bonding lead pins 20 to a wiring board 10.

FIG. 7A shows a state where the lead pins 20 are set in a pin bonding jig 30. In the jig 30, set holes 30a into which shaft portions 20a of the lead pins 20 are to be passed and set in a planar arrangement that is identical with that of connection pads of the wiring board are formed, and set recesses 30b which communicate with the set holes 30a, respectively, and in which head portions 20b of the lead pins 20 are to be housed, respectively are formed. When the lead pins 20 are to be set to the jig 30, a distributing machine for the lead pins 20 is used, and the lead pins 20 are distributed to all of the set holes 30a of the jig 30.

FIG. 7B shows a state where the jig 30 in which the lead pins 20 are set is positioned to the wiring board 10, and the lead pins 20 are bonded to connection pads 12 of the wiring board 10 by solder reflow. As a conductive material for bonding, for example, a solder 14 is previously supplied to the connection pads 12. The jig 30 is passed through a reflow apparatus in a state where the lead pins 20 are supported by the jig, whereby the lead pins 20 are bonded to the connection pads 12.

In the jig 30, the set holes 30a and the set recesses 30b have a slight clearance with respect to the shaft portions 20a and the head portions 20b in order that the lead pins 20 are set by the distributing operation, and, after the lead pins 20 are bonded to the connection pads 12, the jig 30 is upward pulled out. For the sake of description, the clearances are exaggeratingly shown in FIGS. 7A and 7B.

[Patent Reference 1] JP-A-2001-148441
[Patent Reference 2] JP-A-2000-58736

In the above-described wiring board with lead pins which is formed by bonding the lead pins 20 to the wiring board 10, the bonding strength between the lead pins 20 and the connection pads 12 depends on the bonding force by which the head portions 20b are bonded to the connection pads 12. In each of the lead pins 20, the head portion 20b which is larger in diameter than the shaft portion 20a is formed because the bonding area with respect to the solder 14 (conductive material) is ensured by using the end area of the head portion 20b, thereby enabling a predetermined bonding strength (pull strength) to be obtained.

As a method of enhancing the bonding strength of the lead pin 20, a method in which the shape of the head portion 20b of the lead pin 20 is improved, and that in which a basal portion of the lead pin 20 is held by an adhesive resin material have been proposed. However, sufficient bonding strength is not always obtained. In a wiring board with lead pins, particularly, the diameter of the lead pins 20 is becoming smaller because the number of the pins tends to increase. Therefore, a wiring board with lead pins in which, even in the case where lead pins of a small diameter are used, sufficient bonding strength is obtained is requested.

SUMMARY OF THE INVENTION

The invention has been conducted in order to solve these problems. It is an object of the invention to provide a wiring board with lead pins which has sufficient bonding strength of the lead pins, and a preferred method of producing the wiring board.

In order to attain the object, according to a first aspect of the invention, there is provided a wiring board with lead pins including:
connection pads formed on a wiring board, and
lead pins bonded through a conductive material to the connection pads, wherein
each of the lead pins has a head portion that is formed in one end of a shaft portion and is larger in diameter than the shaft portion,
the head portions are bonded to the connection pads by the conductive material,
a face of the wiring board on which the connection pads are formed is resin-sealed by a first resin is thicker than the head portions, except portions to which the head portions are bonded, and
sides of faces of the head portions to which the shaft portions are connected are sealed to be in close contact with the first resin by a second resin.

According to a second aspect of the invention, there is provided a wiring board with lead pins including:
connection pads formed on a wiring board, and
lead pins bonded through a conductive material to the connection pads, wherein
each of the lead pins has a head portion that is formed in one end of a shaft portion and is larger in diameter than the shaft portion,
the head portions are bonded to the connection pads by the conductive material, and
a face of the wiring board on which the connection pads are formed is resin-sealed to a thickness of a resin at which the head portions are partially buried in a thickness direction, together with the lead pins by using a sealing jig.

According to a third aspect of the invention, there is provided the wiring board with lead pins as set forth in the first aspect, wherein
each of the head portions has a tapered portion in which a side bonded to a corresponding one of the connection pads has a larger diameter, and
the tapered portion is resin-sealed to be partially buried in the resin in a thickness direction.

This causes, in cooperation with the anchor effect due to the resin, the lead pins to be bonded to the wiring board, so that the bonding strength of the lead pins can be enhanced.

According to a fourth aspect of the invention, there is provided a method of producing a wiring board with lead pins in which each of the lead pins has a head portion that is formed on one end of a shaft portion and is larger in diameter than the shaft portion and in which the lead pins are bonded to connection pads, the connection pads being formed on the wiring board, the method including the steps of:

supplying a conductive material for bonding the lead pins, to the connection pads;

resin-sealing, by a first resin, a whole face of the wiring board to which the conductive material is supplied, the connection pads being formed on the face, by using a sealing jig to be thicker than the head portions;

removing portions of the first resin which seals the wiring board, the portions covering the conductive material supplied to the connection pads, to form recessed holes in each of which the conductive material is exposed from an inner bottom face;

positioning the head portions of the lead pins to the recessed holes to bond the lead pins to the connection pads by the conductive material; and filling the recessed holes with a second resin to seal the head portions of the lead pins.

Therefore, it is possible to obtain a wiring board with lead pins having sufficient bonding strength.

According to a fifth aspect of the invention, there is provided a method of producing a wiring board with lead pins as set forth in the fourth aspect, wherein in place of the step of forming the recessed holes in the resin sealing the wiring board, in the step of resin-sealing the face of the wiring board on which the connection pads are formed, the wiring board is resin-sealed by using a sealing jig having projections that cover regions to which the conductive material is supplied, and recessed holes in each of which the conductive material is exposed from an inner bottom face are formed in the first resin that seals the wiring board.

According to a sixth aspect of the invention, there is provided the method of producing a wiring board with lead pins as set forth in the fourth or fifth aspect, wherein in the step of resin-sealing the face of the wiring board on which the connection pads are formed, sealing molds are used as a sealing jig, and resin-sealing is performed by using a resin sealing apparatus.

According to a seventh aspect of the invention, there is provided the method of producing a wiring board with lead pins as set forth in any one of the fourth to sixth aspects, wherein in the step of bonding the lead pins to the connection pads, by using a pin distributing jig, the lead pins are positioned to bond to the connection pads.

According to an eighth aspect of the invention, there is provided a method of producing a wiring board with lead pins in which each of the lead pins has a head portion that is formed on one end of a shaft portion and is larger in diameter than the shaft portion and in which the lead pins are bonded to connection pads, the connection pads being formed on the wiring board, as the lead pins, using lead pins having a tapered portion in which a side to be bonded to a corresponding one of the connection pads has a larger diameter, the method including the steps of:

supplying a conductive material for bonding the lead pins, to the connection pads;

positioning the head portions to the connection pads to bond the lead pins to the connection pads by the conductive material; and resin-sealing a face of the wiring board to which the lead pins are bonded, wherein in the resin-sealing step, resin-sealing is performed by using a sealing jig including sealing portions which butt against an outer face of the tapered portion of each of the lead pins to prevent the resin from leaking toward the shaft portions in the resin sealing.

Therefore, a wiring board with lead pins in which lead pins including a tapered portion are used can be preferably produced.

According to a ninth aspect of the invention, there is provided the method of producing a wiring board with lead pins as set forth in the eighth aspect, wherein in the resin-sealing step, the tapered portions are partially buried in the resin in a thickness direction.

According to a tenth aspect of the invention, there is provided the method of producing a wiring board with lead pins as set forth in the eighth or ninth aspect, wherein in the step of bonding the lead pins to the connection pads, as a jig for positioning the lead pins to the connection pads, a pin-distributing jig that functions also as a jig in the resin-sealing step and that includes the seal portions is used.

According to an eleventh aspect of the invention, there is provided a method of producing a wiring board with lead pins in which each of the lead pins has a head portion that is formed on one end of a shaft portion and is larger in diameter than the shaft portion and in which the lead pins are bonded to connection pads, the connection pads being formed on the wiring board, the method including the steps of:

supplying a conductive material for bonding the lead pins, to the connection pads;

positioning the head portions to the connection pads to bond the lead pins to the connection pads by the conductive material; and resin-sealing a face of the wiring board to which the lead pins are bonded, and the step of bonding the lead pins and the step of resin-sealing the wiring board are performed in a same work stage in which a heating apparatus is shared.

Therefore, the production steps of a wiring board with lead pins can be performed more efficiently, and it is possible to obtain a wiring board with lead pins in which the bonding strength of the lead pins is enhanced.

According to the wiring board with lead pins and the method of producing a wiring board with lead pins of the invention, it is possible to enhance the bonding strength between the lead pins and the wiring board, and it is possible to easily produce a wiring board with lead pins in which the bonding strength with respect to the wiring board is enhanced.

DETAILED DESCRIPTION OF THE PREFERRED EMBODIMENTS (First Embodiment)

FIGS. 1A to 1D and 2A to 2D show a first embodiment of the method of producing a wiring board with lead pins of the invention. Hereinafter, the method of producing a wiring board with lead pins will be described in accordance with the steps.

Figure 1A:
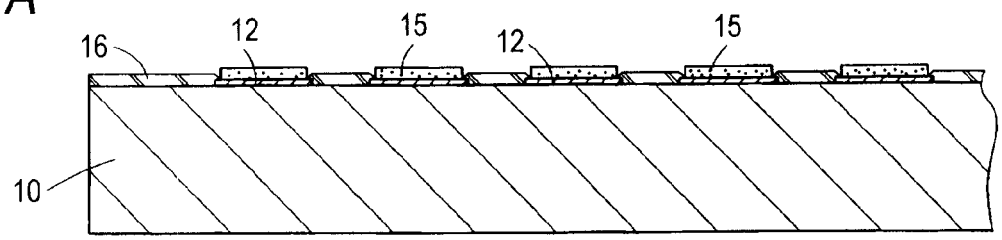
FIGS. 1A to 1D are diagrams showing production steps of a first embodiment of the method of producing a wiring board with lead pins.

FIG. 1A shows a state where, as a conductive material for bonding lead pins to connection pads 12 formed on a wiring board 10, solder bumps 15 are formed on the connection pads 12.

The wiring board 10 of the embodiment is a printed circuit board in which the connection pads 12 to which the lead pins 20 are to bonded are formed on one face of a resin board, and pads (not shown) on which semiconductor chips are to be mounted are formed on the other face. In the both faces of the resin board, wiring patterns are formed in desired shapes by the build-up method or the like.

The one face of the wiring board 10 on which the connection pads 12 are formed is covered by a protective material 16 such as a solder resist, except portions of the connection pads 12 where a circular planer shape is exposed.

The connection pads 12 constitute a part of a wiring pattern which is formed by a copper layer, and are formed by, as protective plating, applying nickel plating and gold plating to the surface of the copper layer in this sequence.

The solder bumps 15 are formed by printing a solder paste in accordance with the planar arrangement of the connection pads 12, and then performing drying. In the lead pins 20, head portions which are to be bonded to the connection pads 12 are formed into an approximately same size as the planar region of the connection pads 12. The solder bumps 15 are formed so as to have a substantially uniform thickness so as to cover the whole faces of the connection pads 12.

Figure 1B:
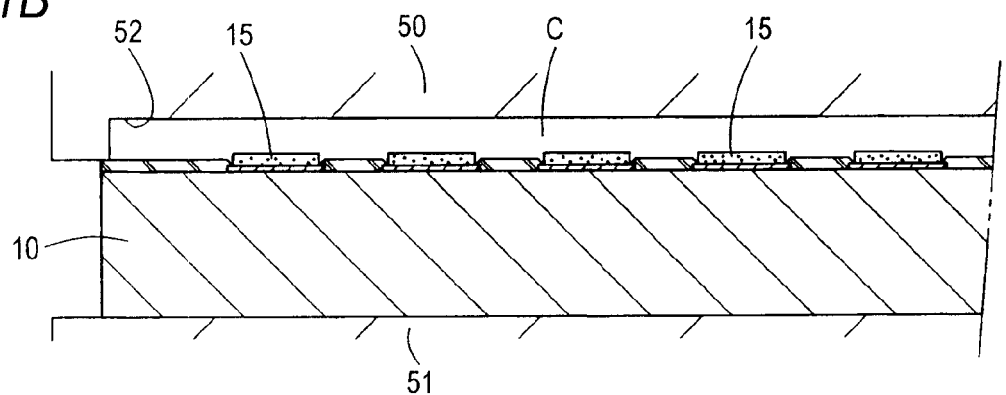
Figure 1C:
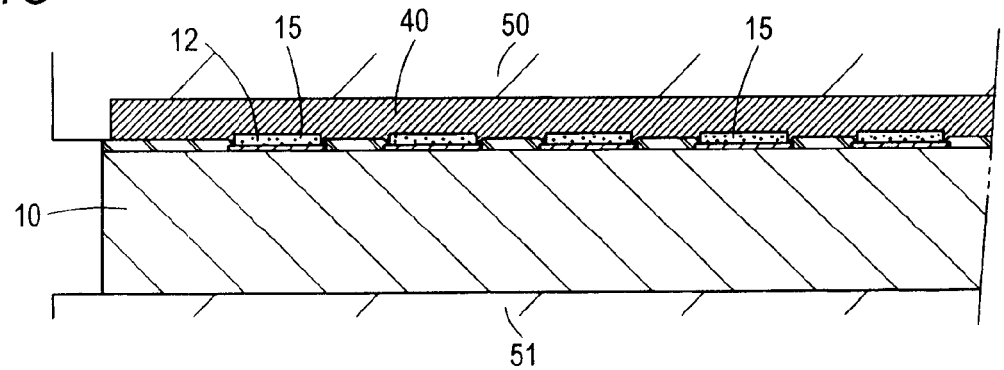

FIGS. 1B and 1C show a step of covering the one face of the wiring board 10 where the solder bumps 15 are formed, i.e., the face where the solder bumps 15 are formed, by a first resin 40 (a covering step by the first resin). In the embodiment, the surface of the wiring board 10 is covered by the first resin 40 by using a resin sealing apparatus.

FIG. 1B shows a state where the wiring board 10 is clamped by upper and lower molds 50, 51 of the resin sealing apparatus. In the upper mold 5, cavity recesses 52 are formed in a face opposed to the wiring board 10 so that, in the state where the wiring board 10 is clamped, cavities C are formed with respect to the one face of the wiring board 10. Each of the cavity recesses 52 is formed so that the depth from the surface of the corresponding solder bump 15 to the inner bottom face (ceiling face) of the cavity recess 52 is greater than the thickness of the head portions 20b of the lead pins.

FIG. 1C shows a state where the wiring board 10 is clamped by the upper and lower molds 50, 51 and the cavities C are filled with the first resin 40. A thermosetting resin of epoxy or the like is used as the first resin 40. The surface of the wiring board 10 is covered by the resin, and the resin is thermally cured. In the case where the surface of the wiring board 10 is resin-sealed by using the resin sealing apparatus, the first resin 40 is thermally cured by heating the molds. When resin sealing is to be performed, therefore, the mold temperature, the melting temperatures of the solder material and the resin material, and the thermal curing temperature are set so that the solder bumps 15 do not melt.

Figure 1D:
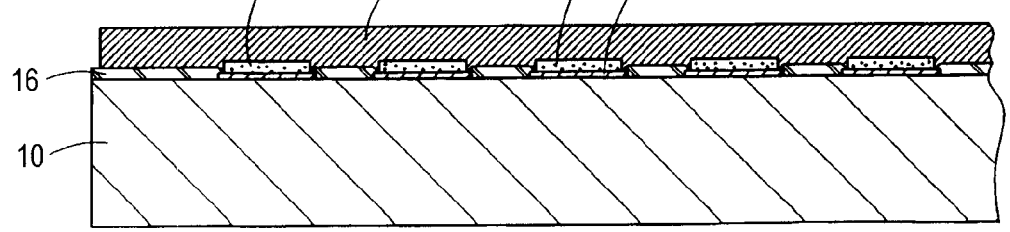

FIG. 1D shows a state where the whole face of the wiring board 10 where the solder bumps 15 are formed is covered by the first resin 40.

Then, laser processing or dry etching is applied to the face of the wiring board 10 which is covered by the first resin 40, to remove only the first resin 40 of the portions which cover the solder bumps 15, the first resin 40.

Figure 2A:
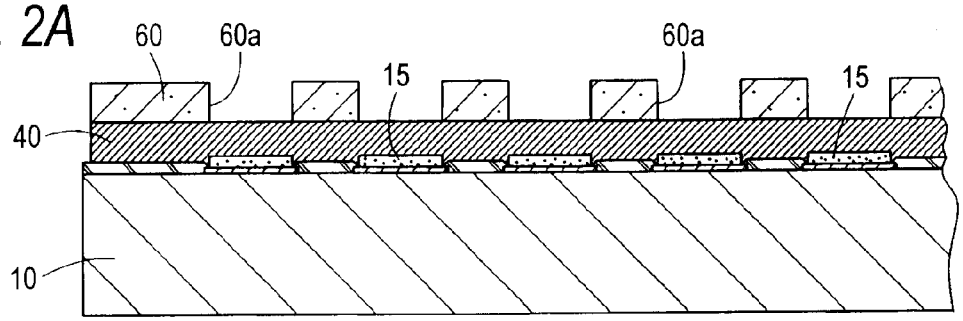
FIGS. 2A to 2D are diagrams showing production steps of the first embodiment of the method of producing a wiring board with lead pins.
Figure 2B:
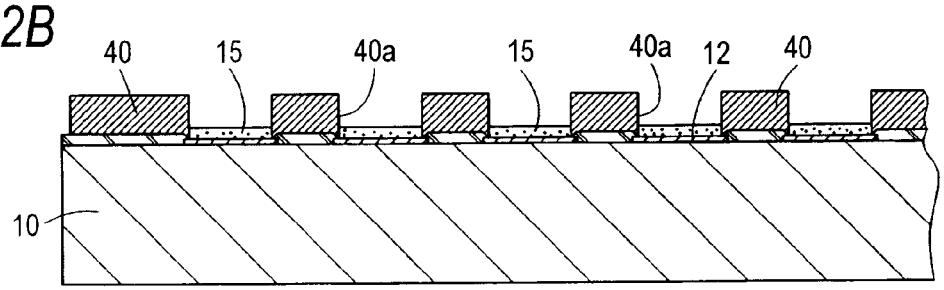

FIGS. 2A and 2B show a step of removing the portions of the first resin 40 where the solder bumps 15 are formed (resin removing step). FIG. 2A shows a state where, in order to remove the first resin 40 by dry etching, the surface of the first resin 40 is covered by a photosensitive resist 60, and exposing and developing are applied to the resist 60, whereby the resist 60 is patterned so that the surface of the first resin 40 is exposed in the portions where the solder bumps 15 are formed (the positions immediately above the solder bumps 15).

The resist 60 is patterned, and dry etching such as plasma etching is applied, thereby removing resin portions which are not covered by the resist 60.

FIG. 2B shows a state where recessed holes 40a are formed in portions where the solder bumps 15 are formed, by removing the portions of the first resin 40 which cover the solder bumps 15, and the solder bumps 15 are exposed from inner bottom faces of the recessed holes 40a. In the one face of the wiring board 10 which is covered by the first resin 40, namely, the solder bumps 15 are exposed from inner bottom faces in accordance with the planar arrangement of the solder bumps 15. The recessed holes 40a which have a circular planer shape are disposed in a large number.

Alternatively, the portions of the first resin 40 which cover the solder bumps 15 may be removed by laser processing in place of dry etching.

Figure 2C:
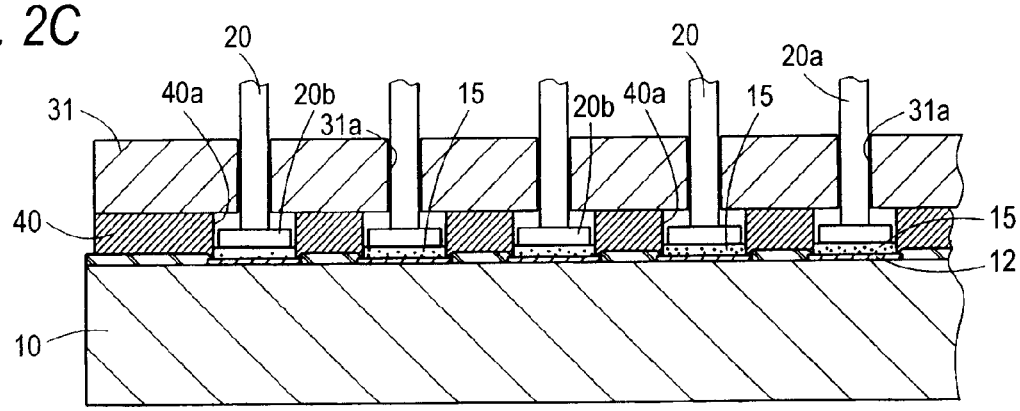

FIG. 2C shows a step of bonding the lead pins 20 to the solder bumps 15 (lead pin bonding step).

Similarly with the prior art, the operation of bonding the lead pins 20 to the solder bumps 15 is performed by an operation in which a jig 31 for distributing the lead pins 20 is used and bonding is performed by solder reflow. In the jig 31, set holes 31a into which the lead pins 20 are to be set are formed in accordance with the planar arrangement of the solder bumps 15 which are formed in the wiring board 10, i.e., the planar arrangement of the connection pads 12.

As shown in FIG. 2C, the jig 31 into which the lead pins 20 are set is positioned to the wiring board 10, the head portions 20b are directed vertically downward, and the wiring board and the jig are passed through a solder reflow apparatus, whereby the lead pins 20 are bonded to the connection pads 12.

As shown in FIG. 2C, when the lead pins 20 are set to the wiring board 10, the head portions 20b of the lead pins 20 enter the recessed holes 40a which are formed in the first resin 40. The first resin 40 is formed to be thicker than the thickness of the head portions 20b. In each of the lead pins 20, therefore, the whole of the lead pin 20 in the thickness is buried in the corresponding recessed hole 40a, and, in this state, the lead pin 20 is bonded to the corresponding connection pad 12.

By the solder reflow, the solder bumps 15 melt, the gaps between the connection pads 12 and the head portions 20b of the lead pins 20 are filled with a solder 15a, and the solder 15a creeps up along the side faces of the head portions 20b. In the solder reflow, even when the solder 15a creeps up to the upper faces (the faces to which shaft portions 20a are connected) of the head portions 20b, there arises no serious problem.

Figure 2D:
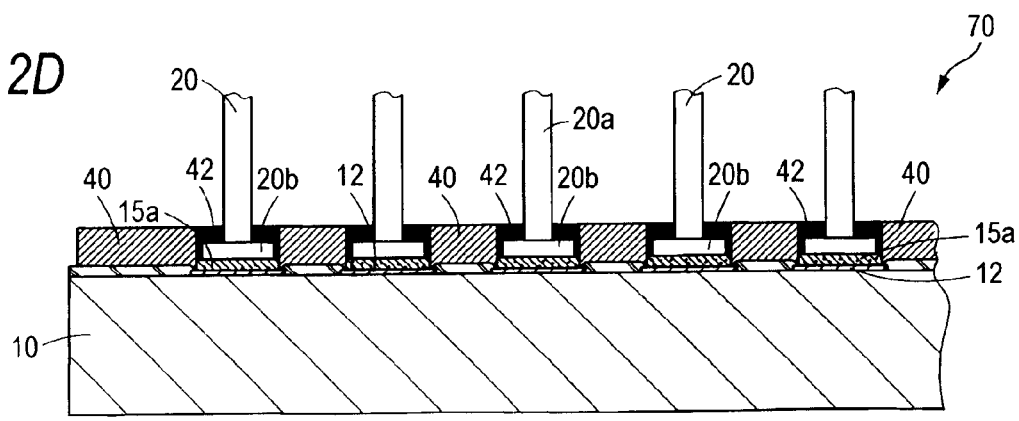

FIG. 2D shows a state where, after the lead pins 20 are bonded to the wiring board 10, the recessed holes 40a which are formed in the first resin 40, or in other words the recessed holes 40a in which the head portions 20b of the lead pins 20 are housed are filled with a second resin 42 (a step of supplying a second resin).

As shown in the figure, the second resin 42 is supplied by the amount which is required for filling the recessed holes 40a and making the surface of the second resin 42 flush with that of the first resin 40. The operation of supplying the second resin 42 into the recessed holes 40a may be performed by, for example, a method in which a paste-like resin is potted.

The second resin 42 is integrated with the first resin 40, and functions to hold the head portions 20b of the lead pins 20 to the wiring board 10 by the anchor effect. As the first resin 40 and the second resin 42, therefore, resin materials which exert strong mutual adhesive force are selected. The first resin 40 and the second resin 42 may be the same resin material, or different resin materials.

As the first resin 40, for example, an epoxy type resin may be used. In order to improve the close contact property with the second resin 42, a roughing process or a process using a surfactant may be applied to the surface of the first resin 40. As the second resin 42, a resin which has a high close contact property with the lead pins 20, for example, an epoxy type resin may be used. Preferably, a resin having a curing temperature which is lower than the melting point of the solder is used as the second resin 42.

After the second resin 42 is supplied to the recessed holes 40a, the second resin 42 is thermally cured by heat curing to obtain the wiring board 70 with lead pins.

In the wiring board 70 with lead pins of the embodiment, the head portions 20b of the lead pins 20 are covered by the second resin 42, and the first resin 40 and the second resin 42 are integrated with each other, thereby allowing the anchor effect of holding the head portions 20b of the lead pins 20 to effectively function.

In addition to the bonding force of bonding the lead pins 20 by the solder 15a, therefore, the force of holding the load pins 20 by the first resin 40 and the second resin 42 acts, so that the bonding strength or pull strength of the lead pins 20 can be enhanced.

With respect to the first resin 40, particularly, the surface of the wiring board 10 is sealed by using the resin sealing apparatus, and hence the close contact property between the wiring board 10 and the first resin 40 is improved, thereby contributing to the improved the bonding strength of the lead pins 20. In the case where the surface of the wiring board 10 is sealed by the first resin 40 by using the resin sealing apparatus, the flatness of the surface of the first resin 40 is high, and, even when the thickness of the first resin 40 is relatively small, the resin can contribute to the improvement of the pin bonding strength. Therefore, there arises no problem that, in the case where the wiring board is attached to a socket, the insertion length of the shaft portions 20a of the lead pins 20 is shortened by the thickness of the resin covering the surface of the wiring board 10.

As the method of resin-sealing the surface of the wiring board 10 by the first resin 40, a method may be employed in which a resin sealing apparatus based on molds is not used, and resin sealing is performed by using a jig for sealing. Namely, in the case where, when the surface of the wiring board 10 is to be resin-sealed, application of a high resin pressure is not required, a method may be employed in which the wiring board 10 is clamped by a jig for sealing, the first resin 40 is injected into the cavities, and then heat curing is performed.

(Modification)

Figure 3A:
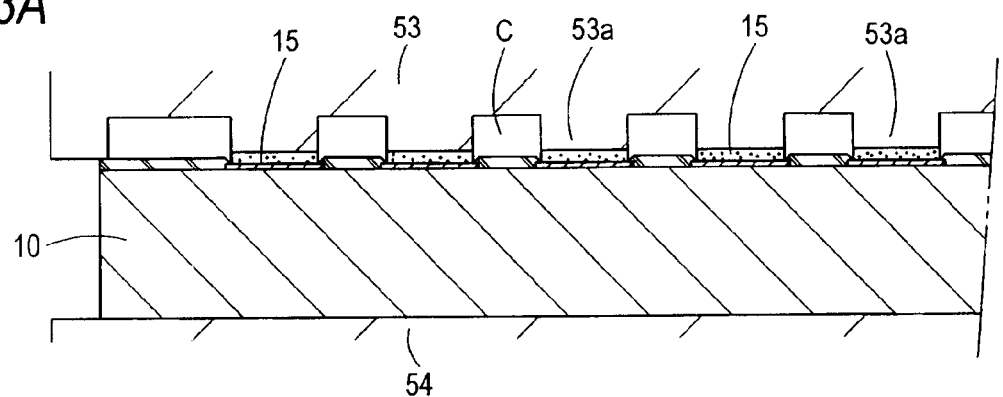
FIGS. 3A to 3C are diagrams showing a modification of the first embodiment of the method of producing a wiring board with lead pins.
Figure 3B:
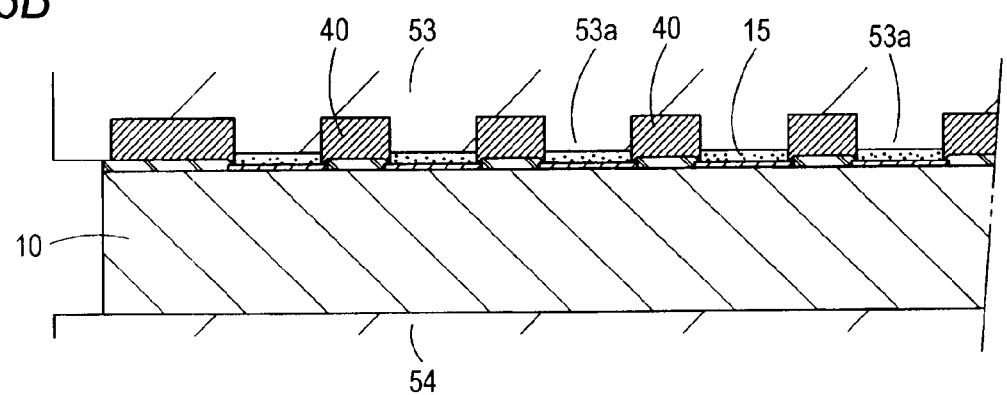
Figure 3C:
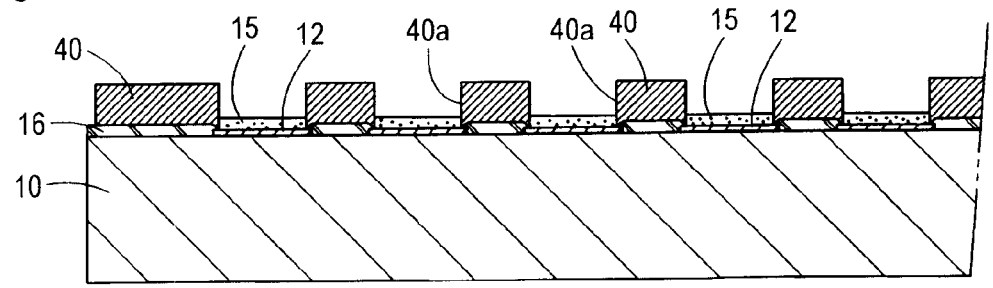

FIGS. 3A to 3C show a modification of the method of producing a wiring board with lead pins shown in FIGS. 1A to 1D and 2A to 2D. In the modification, when the surface of the wiring board 10 is to be covered by the first resin 40 by using a resin sealing apparatus, the portions where the solder bumps 15 are formed are resin-sealed by using an upper mold 53 in which projections 53a are disposed, in order to prevent the first resin 40 from adhering to the portions.

FIG. 3A shows a state where the wiring board 10 on which the solder bumps 15 are formed is clamped by upper and lower molds 53, 54. In the upper mold 53, the projections 53a are formed in places which cover the portions where the solder bumps 15 are formed, in accordance with the positions where the solder bumps 15 are formed, i.e., the planar positions of the connection pads 12 which are formed on the wiring board 10.

When the wiring board 10 is clamped by the upper and lower molds 53, 54, the end faces of the projections 53a of the upper mold 53 butt against the solder bumps 15 formed on the wiring board 10. When the first resin 40 is injected into the cavities in this state, the cavities C are filled with the first resin 40 except the portions where the solder bumps 15 are formed (FIG. 3B).

FIG. 3C shows a state where the face of the wiring board 10 on which the solder bumps 15 are formed is covered by the first resin 40. When resin sealing is performed by using the upper mold 53 including the projections 53a, the resin 40 is shaped into a state where, in the portions where the solder bumps 15 are formed, the recessed holes 40a in which the solder bumps 15 are exposed from the inner bottom face are formed.

In steps subsequent to the step of FIG. 3C, similarly with the steps shown in FIGS. 2C and 2D, the lead pins 20 are bonded to the connection pads 12 by solder reflow, and the recessed holes 40a formed in the wiring board 10 are filled with the second resin 42, thereby forming a wiring board with lead pins.

According to the modification, the recessed holes 40a into which the lead pins 20 are to be bonded (set) can be formed when the face of the wiring board 10 on which the solder bumps 15 are formed is covered by the first resin 40. Therefore, the modification has an advantage that, unlike in the first embodiment, dry etching processing or laser processing for forming the recessed holes 40a in the first resin 40 is not required.

In order to prevent the resin from entering or adhering to the surfaces of the solder bumps 15 when the wiring board 10 is clamped by the upper mold 53, a configuration is effective where a member having buffering properties such as silicone is attached to the end faces of the projections 53a of the upper mold 53, or the projections 53a themselves are formed by a material having buffering properties.

(Second Embodiment)

FIGS. 4A and 4B, and 5A and 5B show a second embodiment of the method of producing a wiring board with lead pins of the invention.

Figure 4A:
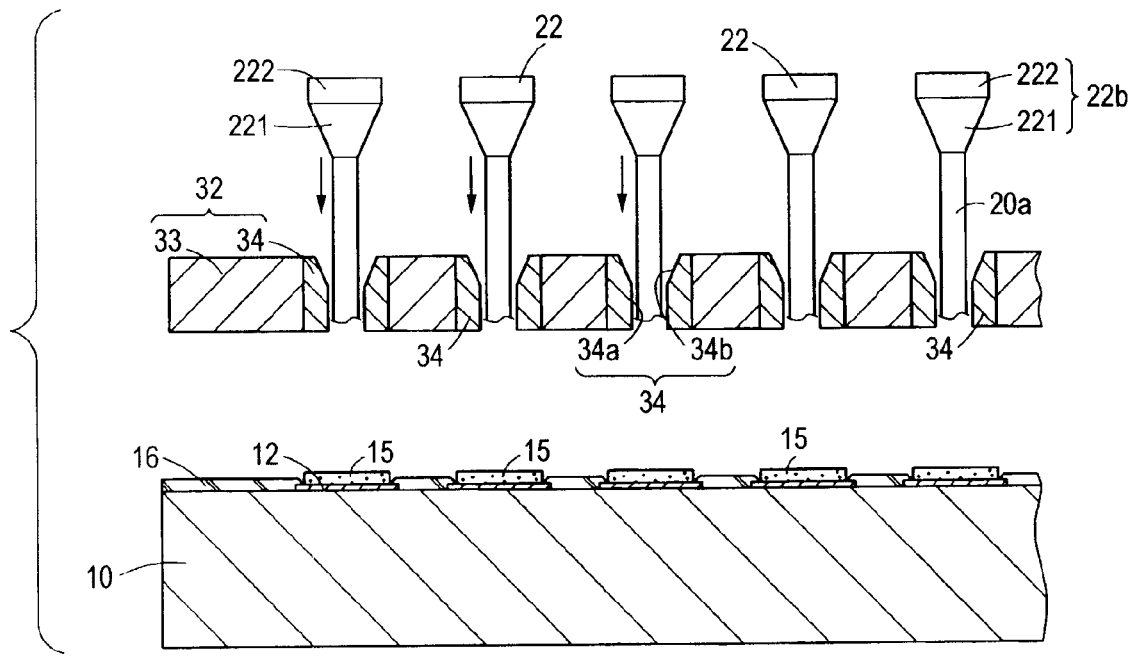
FIGS. 4A and 4B are diagrams showing production steps of a second embodiment of the method of producing a wiring board with lead pins.

FIG. 4A shows the wiring board 10, lead pins 22 which are to be bonded to the connection pads 12 formed on the wiring board 10, and a jig 32 to which the lead pins 22 are to be set. The configuration where the solder bumps 15 are formed on the connection pads 12 of the wiring board 10 is similar to that of the wiring board 10 in the first embodiment In the embodiment, in each of the lead pins 22, a head portion 22b includes a tapered portion 221 and a large-diameter portion 222, and a shaft portion 22a is connected to the tapered portion 221 to form the lead pin 22. The tapered portion 221 is formed into a truncated conical shape which extends from a basal part of the shaft portion 22a to the large-diameter portion 222 on the basal portion side that is to be bonded to the corresponding connection pad 12. The sectional shape of the outer face of the tapered portion 221 is formed into an inclined face in which the side of the large-diameter portion 222 is wider.

The large-diameter portion 222 is a portion in which the end face opposed to the connection pad 12 of the wiring board 10 is to be bonded to the connection pad 12 through a bonding conductive material such as a solder. The large-diameter portion 222 is formed to be slightly smaller in diameter than the connection pad 12.

The jig 32 has a function as a distributing jig which holds the lead pins 22 while positioning the lead pins to the connection pads 12 formed on the wiring board 10, and another function as a sealing jig which performs sealing when the surface of the wiring board 10 is resin-sealed.

The jig 32 includes: sealing portions 34 where set holes 34a into which the shaft portions 22a of the lead pins 22 are to be inserted, and tapered holes 34b against which the outer faces of the tapered portions 221 of the lead pins 22 are to be butt are formed; and a base body portion 33 which holds the sealing portions 34.

In each of the sealing portions 34, the set hole 34a is formed to have a diameter in which a clearance for allowing the shaft portion 22a of the corresponding lead pin 22 to be inserted is formed. The tapered hole 34b is formed to have a taper angle which is equal to that of the tapered portion 221 of the lead pin 22, and disposed on the one opening side of the set hole 34a which is formed to be passed through the sealing portion 34. In the hole portion of each of the sealing portions 34, namely, one side is formed as the tapered hole 34b, and the other side is formed as the set hole 34a. The sealing portions 34 are requested to have sealing properties for preventing resin leaking from occurring in the case where the surface of the wiring board 10 is resin-sealed. Therefore, the sealing portions 34 are formed by a material which has elasticity, buffering properties, and strength of a certain level for withstanding the resin sealing process, such as silicone rubber or fluorine rubber. In the sealing portions 34, a non-adhesive material to which a resin hardly adheres, such as a fluorine resin is used. In the base body portion 33, in order to allow the portion to hold the sealing portions 34, prevent the lead pins 22 from being positionally displaced, and adequately perform the resin sealing operation, a material having a strength of a certain level, for example a metal material such as stainless steel is used.

The lead pins 22 are distributed to the above-described jig 32, the wiring board 10 and the jig 32 are positioned to each other in a state where the lead pins 22 are held by the jig 32, and the lead pins 22 are soldered by solder reflow.

Figure 4B:
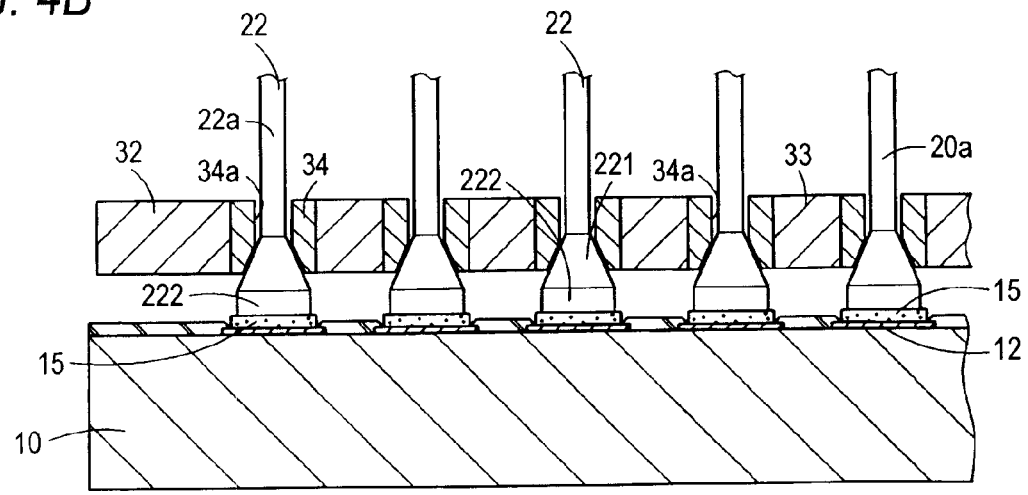

FIG. 4B shows a state where the lead pins 22 are soldered. The lead pins 22 are soldered while the large-diameter portions 222 are directed vertically downward, and the lead pins 22 are erected on the connection pads 12 of the wiring board 10 by the jig 32. In a step of bonding the lead pins 22, the jig 32 functions to guide the lead pins 22 to the respective bonding positions.

After the lead pins 22 are bonded to the connection pads 12 of the wiring board 10, the surface of the wiring board 10 to which the lead pins 22 are bonded is resin-sealed.

Figure 5A:
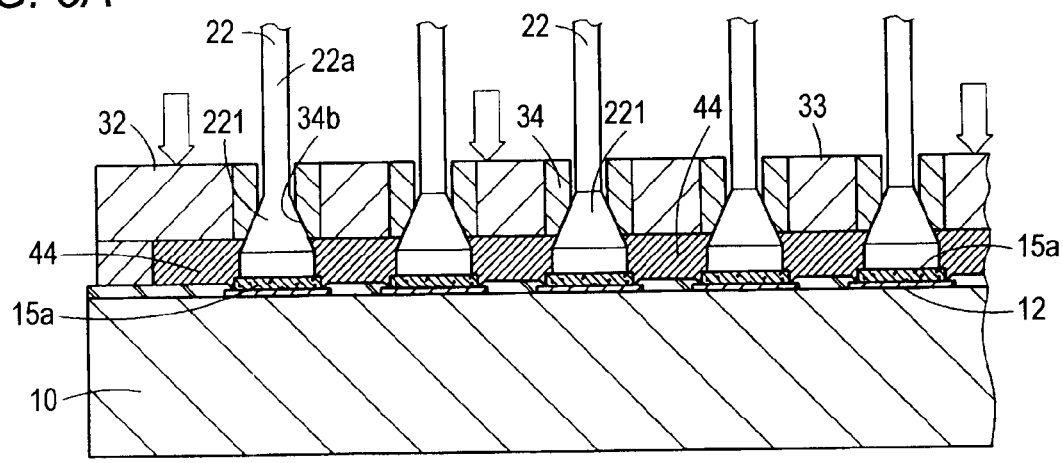
FIGS. 5A and 5B are diagrams showing production steps of the second embodiment of the method of producing a wiring board with lead pins.

FIG. 5A shows a step of, by using the jig 32 which is used in the step of bonding the lead pins 22, sealing the surface of the wiring board 10 by a resin 44 (resin sealing step). In the step, in a state where the jig 32 is pressed toward the wiring board 10, cavities (gap portions) which are formed between the face of the jig 32 opposed to the wiring board 10 and the surface of the wiring board 10 are filled with the resin 44, and the surface of the wiring board 10 is covered by the resin 44. As the resin 44, a thermosetting resin material is used.

When the jig 32 is pressed toward the wiring board 10, the outer faces of the tapered portions 221 of the lead pins 22 butt against the inner faces of the tapered holes 34b of the sealing portions 34 of the jig 32, and a state where the outer faces of the lead pins 22 are sealed is obtained. This prevents the resin 44 from, in the resin sealing step, leaking (entering) into the shaft portions 22a of the lead pins 22. The sealing portions 34 are made of a material having elasticity and buffering properties, such as silicone rubber, in order that, in the resin sealing step, the resin 44 is surely prevented from leaking into the shaft portions 22a of the lead pins 22.

In the step where the surface of the wiring board 10 is sealed by the resin 44 by using the jig 32, similarly with the first embodiment, the wiring board 10 is held by the lower mold, the wiring board 10 is clamped by the lower mold and the jig 32, and then resin sealing is performed. In the resin sealing step, while applying a low resin pressure, the resin 44 fills the gap between the jig 32 and the wiring board 10, and hence the wiring board is clamped by the jig 32 and the lower mold so as to resist the resin pressure. After filling with the resin 44, the jig 32 and the lower mold are heated to thermally cure the resin 44.

Figure 5B:
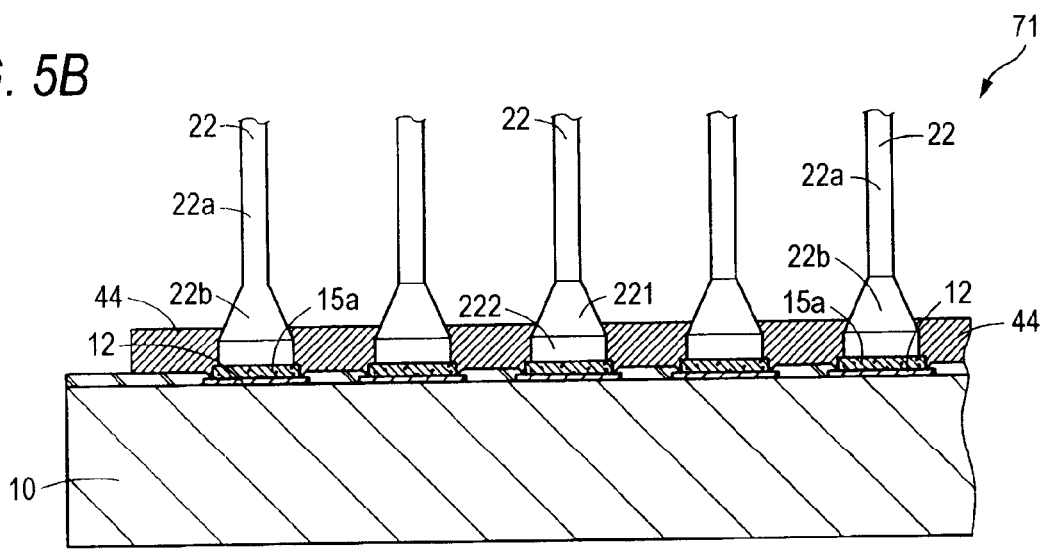

After the thermal curing of the resin 44, the jig 32 is removed to obtain the wiring board 71 with lead pins (FIG. 5B).

The wiring board 71 with lead pins is formed by bonding the head portions 22b of the lead pins 22 through the solder 15a, to the connection pads 12 formed on the wiring board 10, and sealing the face of the wiring board 10 on which the connection pads 12 are formed, and the basal portions of the head portions 22b of the lead pins 22 by the resin 44. The sealing by the resin 44 is performed so that the tapered portions 221 of the head portions 22b of the lead pins 22 are partially buried in the resin in the thickness direction.

In the wiring board 71 with lead pins of the embodiment, in addition to the bonding force of bonding the head portions 22b of the lead pins 22 to the connection pads 12 by the solder 15a, the holding of the basal portions of the head portions 22b by the resin 44 can enhance the bonding strength or pull strength of the lead pins 22 with respect to the wiring board 10. Particularly, the configuration where the resin 44 is disposed so as to partially cover the tapered portions 221 of the head portions 22b causes the resin 44 to exert an anchor effect in the direction of pulling out the lead pins 22. Therefore, the bonding strength of the lead pins 22 can be enhanced more effectively.

In the wiring board 71 with lead pins of the embodiment, the head portions 22b of the lead pins 22 are made larger in diameter than the shaft portions 22a, whereby the bonding areas between the lead pins 22 and the connection pads 12 are ensured so as to obtain the required bonding strength. Furthermore, the bonding strength of the lead pins 22 is enhanced by holding the basal portions of the lead pins 22 by the resin 44.

In the case where the lead pins have a small diameter in order that the lead pins are arranged at a high density, also the diameter of the head portions is restricted. In such a case, the head portions of the lead pins are formed so as to have the tapered portions 221, respectively as in the embodiment, the surface of the wiring board is covered by a resin, and, in the covering process, the resin is disposed so as to cover the tapered portions 221, whereby the weakening of the bonding strength of the lead pins which is caused by the reduction in diameter of the lead pins can be compensated.

In the embodiment, the head portion 22b of each of the lead pins 22 is formed by the tapered portion 221 and the large-diameter portion 222. The taper angle of the tapered portion 221, the height of the large-diameter portion 222, and the like can be arbitrarily set. In the embodiment, for example, the tapered portion 221 and the large-diameter portion 222 are disposed in each of the head portions 22b. Alternatively, the large-diameter portion 222 may not be disposed, and only the tapered portion 221 may be disposed.

In the embodiment, the inclination angle of the tapered holes 34b of the sealing portions 34 disposed in the jig 32 is made equal to that of the tapered portions 221 of the lead pins 22, whereby the resin sealing properties of the sealing portions 34 is improved. Alternatively, the sealing portions 34 may be disposed so as to simply butt against the outer faces of the tapered portions 221 of the lead pins 22.

(Third Embodiment)

Figure 6A:
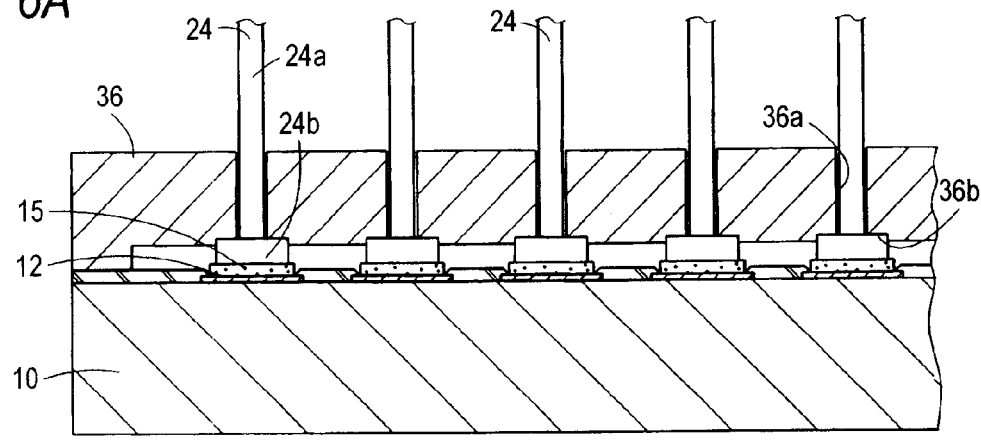
FIGS. 6A to 6C are diagrams showing production steps of a third embodiment of the method of producing a wiring board with lead pins.
Figure 6B:
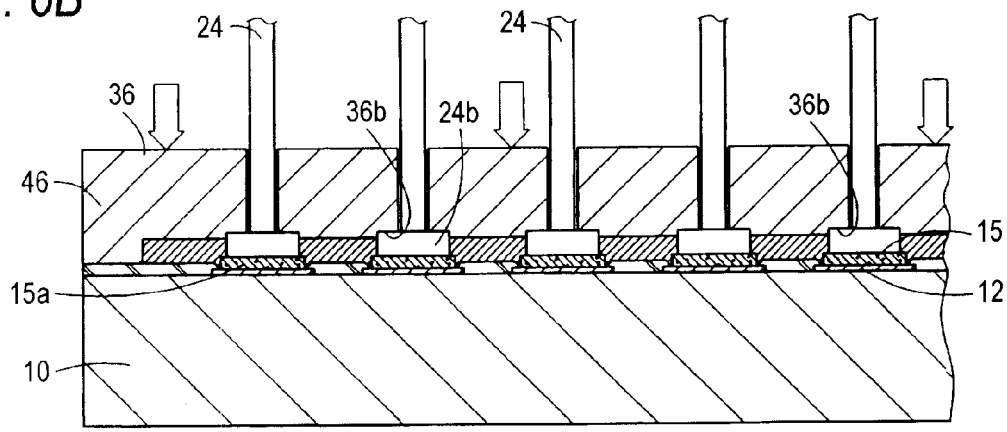
Figure 6C:
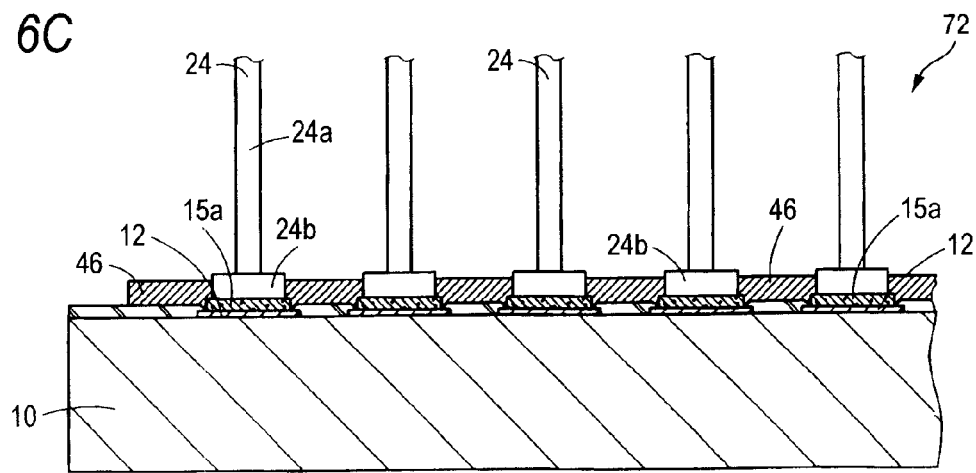
Figure 7A:
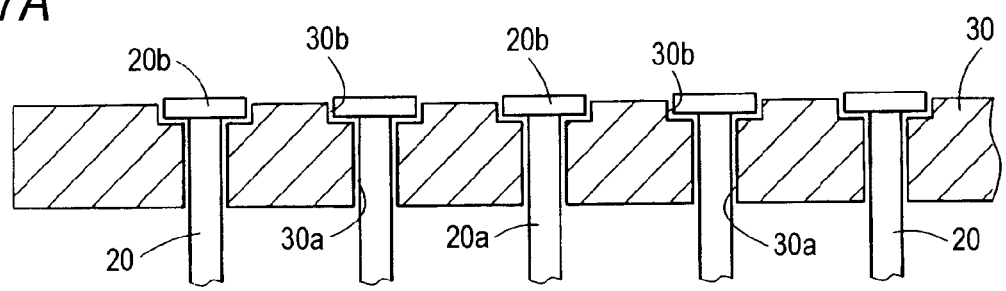
FIGS. 7A and 7B are diagrams showing a conventional method of producing a wiring board with lead pins.
Figure 7B:
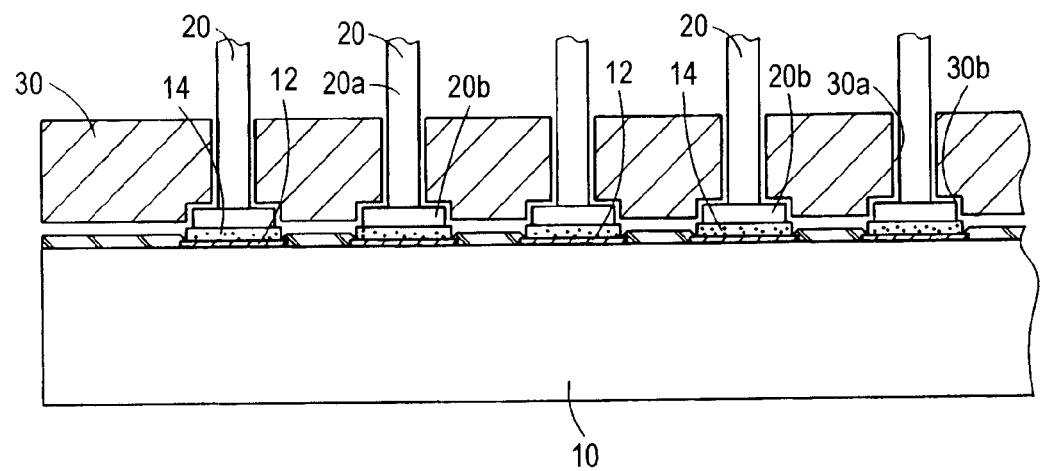

FIGS. 6A to 6C show a third embodiment of the method of producing a wiring board with lead pins of the invention.

In the second embodiment above, the example in which the wiring board 71 with lead pins is formed by using the distributing jig 32 holding the lead pins 22, also as a jig for covering the surface of the wiring board 10 by the resin 44 has been described. In the embodiment, by contrast, a step of soldering lead pins by using a jig for distributing the lead pins, and that of sealing the surface of the wiring board by a resin are performed in the same work stage, whereby production can be performed as a series of working steps.

FIG. 6A shows a step of positioning and holding lead pins 24 to the wiring board 10 by using a jig 36 for distributing the lead pins 24, and bonding the lead pins 24 to the connection pads 12. In the jig 36, set holes 36a through which shaft portions 24a of the lead pins 24 are to be passed, and set recesses 36b with which head portions 24b of the lead pins 24 are to be engaged are disposed.

The operation of bonding the lead pins 24 to the connection pads 12 is performed in the following manner. The head portions 24b are directed vertically downward. At the positions where the head portions 24b are opposed to the connection pads 12, the lead pins 24 are positioned to the wiring board 10 by the jig 36. The wiring board 10 is placed on a hot plate or the like to heat the solder bumps 15. After the solder bumps 15 are heated to a temperature at which the solder bumps melt, the temperature of the hot plate is lowered to a temperature at which the solder 15a is solidified, whereby the lead pins 24 are bonded to the connection pads 12.

In a state where the wiring board 10 is clamped by the jig 36, next, a resin 46 is injected between opposed faces of the jig 36 and the wiring board 10, and the resin 46 is thermally cured (resin sealing step).

The jig 36 is pressed toward the wiring board 10, whereby the set recesses 36b of the jig 36 press the faces of the head portions 24b to which the shaft portions 24a are connected (the faces opposite to those which are opposed to the connection pads 12), to prevent the resin 46 from leaking to the shaft portions 24a of the lead pins 24. In the state where the gap portions (cavities) are filled with the resin 46, the resin 46 is heated while the jig 36 presses the wiring board 10, thereby causing the resin 46 to be thermally cured.

In the heating of the resin 46, in addition to the method in which heating is performed from the side of the wiring board 10 by using the hot plate, an additional method such as that which uses an infrared heater may be concurrently used.

After the resin 46 is thermally cured, the jig 36 is removed to obtain the wiring board 72 with lead pins (FIG. 6C).

In the wiring board 72 with lead pins of the embodiment, the head portions 24b of the lead pins 24 are bonded to the connection pads 12 by the solder 15a, the face of the wiring board 10 where the connection pads are formed is sealed by the resin 46, and the head portions 24b of the lead pins 24 are partially buried in the resin 46 in the thickness direction, whereby the head portions 24b are held by the resin 46 and the holding property of the lead pins 24 is improved.

In the embodiment, the jig 36 which is used for bonding the lead pins 24 to the connection pads 12 of the wiring board 10 is used also as a jig for covering the surface of the wiring board 10 by the resin 46, and the soldering step and the step of covering the surface of the wiring board 10 by the resin 46 are not performed as separate steps, but performed in the same stage in which the same heating mechanism is used, whereby the wiring board 72 with lead pins can be efficiently produced.

In the above-described embodiments, a solder is used as the conductive material for bonding the lead pins to the connection pads. Alternatively, any one of solders of various compositions may be used. For example, a tin-based solder such as a tin-antimony alloy solder may be used a lead-free conductive material.

What is claimed is:

1. A wiring board with lead pins comprising:
   connection pads formed on a wiring board, and
   lead pins bonded through a conductive material to the connection pads, wherein
   each of the lead pins has a head portion that is formed in one end of a shaft portion and is larger in diameter than the shaft portion,
   the head portions are bonded to the connection pads by the conductive material, and
   a face of the wiring board on which the connection pads are formed is resin-sealed with a resin, the resin directly contacting and burying only part of each of the head portions such that part of each head portion is exposed from the resin, and the resin also directly contacting the conductive material.

2. A wiring board with lead pins comprising:
   connection pads formed on a wiring board, and
   lead pins bonded through a conductive material to the connection pads, wherein
   each of the lead pins has a head portion that is formed in one end of a shaft portion and is larger in diameter than the shaft portion, each of the head portions having a tapered portion in which a diameter increases from the shaft portion toward a distal end of the head portion disposed at a side of the head portion which is bonded to a corresponding one of the connection pads by the conductive material, the distal end of the head portion being a planar surface, and
   a face of the wiring board on which the connection pads are formed is resin-sealed with a resin, the resin burying only part of each of the tapered portions such that part of each tapered portion and an entirety of each shaft portion are exposed from the resin, the resin also burying the conductive material.

3. The wiring board with lead pins as set forth in claim 2, wherein
   the resin includes
      a first resin defining recessed holes each exposing the conductive material to which the head portions are bonded, and a second resin burying the head portions in the recessed holes, the first resin and the second resin being in close contact with each other, the first resin having a thickness larger than that of the head portion, and only part of the tapered portions are buried with the second resin.

4. The wiring board with lead pins as set forth in claim 1, wherein at least part of each head portion is exposed from the conductive material.

5. The wiring board with lead pins as set forth in claim 4, wherein the conductive material is disposed between each head portion and corresponding connection pad.

6. The wiring board with lead pins as set forth in claim 1, wherein the resin defines a planar outer surface, the planar outer surface of the resin being opposite to a surface of the resin provided on the face of the wiring board on which the connection pads are formed.

7. A wiring board with lead pins comprising:

connection pads formed on a wiring board, and lead pins bonded through a conductive material to the connection pads, wherein each of the lead pins has a head portion that is formed in one end of a shaft portion and is larger in diameter than the shaft portion, the head portions are bonded to the connection pads by the conductive material, and a face of the wiring board on which the connection pads are formed is resin-sealed with a resin, the resin directly contacting and burying at least a part of each of the head portions, and the resin also directly contacting the conductive material, wherein the resin includes:

a first resin having a thickness larger than that of each of the head portions and defining recessed holes each exposing the conductive material to which the head portions are bonded, and a second resin provided in the recessed holes defined by the first resin so as to directly contact each of the head portions and to bury all parts of each of the head portions, the second resin also directly contacting a side face of the recessed hole, and the first resin and the second resin being in close contact with each other, wherein the resin defines a planar outer surface, the planar outer surface of the resin being opposite to a surface of the resin provided on the face of the wiring board on which the connection pads are formed, the planar outer surface of the resin including an outer surface of the first resin which is level with an outer surface of the second resin.

8. The wiring board with lead pins as set forth in claim 1, wherein each head portion has a tapered portion in which a diameter increases from the shaft portion toward a distal end of the head portion disposed at a side of the head portion which is bonded to a corresponding one of the connection pads by the conductive material, the distal end of the head portion being a planar surface.

9. The wiring board with lead pins as set forth in claim 8, wherein each head portion further includes a cylindrical portion which provides the distal end of the head portion, and the tapered portion is provided between the cylindrical portion and the shaft portion of each lead pin.

10. The wiring board with lead pins as set forth in claim 8, wherein the distal end of each head portion is an end of the tapered portion such that a diameter of each head portion continuously increases from the shaft portion to the distal end.

11. The wiring board with lead pins as set forth in claim 2, wherein each head portion further includes a cylindrical portion which provides the distal end of the head portion, and the tapered portion is provided between the cylindrical portion and the shaft portion of each lead pin.

12. The wiring board with lead pins as set forth in claim 11, wherein the resin buries an entirety of each cylindrical portion, surrounds a part of each tapered portion, and exposes part of each tapered portion and an entirety of each shaft portion.

13. The wiring board with lead pins as set forth in claim 2, wherein the distal end of each head portion is an end of the tapered portion such that a diameter of each head portion continuously increases from the shaft portion to the distal end.

* * * * *